United States Patent [19]

Reif et al.

[11] Patent Number: 4,579,609

[45] Date of Patent: Apr. 1, 1986

[54] GROWTH OF EPITAXIAL FILMS BY CHEMICAL VAPOR DEPOSITION UTILIZING A SURFACE CLEANING STEP IMMEDIATELY BEFORE DEPOSITION

[75] Inventors: L. Rafael Reif, Brookline; Thomas J. Donahue, Cambridge; Wayne R. Burger, Belmont, all of Mass.

[73] Assignee: Massachusetts Institute of Technology, Cambridge, Mass.

[21] Appl. No.: 618,592

[22] Filed: Jun. 8, 1984

[51] Int. Cl.$^4$ ................ H01L 21/203; H01L 21/302
[52] U.S. Cl. .................... 148/175; 29/576 E; 29/576 B; 148/DIG. 17; 148/DIG. 158; 156/612; 204/192 E; 204/192 S; 204/192 EC; 427/39
[58] Field of Search .......... 148/175; 29/576 E, 576 B; 204/192 E, 192 S, 192 EC, 192 D; 156/612; 427/39, 86

[56] References Cited

U.S. PATENT DOCUMENTS

| | | | |
|---|---|---|---|
| 3,021,271 | 2/1962 | Wehner | 204/192 |
| 3,316,130 | 4/1967 | Dash et al. | 148/175 |
| 3,484,358 | 12/1969 | Androshuk et al. | 204/192 D |
| 3,485,666 | 12/1969 | Sterling et al. | 204/192 D |
| 4,412,903 | 11/1983 | Green et al. | 204/192 C |
| 4,428,111 | 1/1984 | Swartz | 29/576 E |

OTHER PUBLICATIONS

"Silicon Molecular Beam Epitaxy with Simultaneous Ion Implant Doping", by Yusuke Ota, *J. Appl. Phys.* 51(2), 2/80.
"Ionized-Cluster Beam Deposition", by Takagi et al., *J. Voc. Sci. Technol.*, vol. 12, No. 6, Nov./Dec. 1975.
"Introduction to Chemical Vapor Deposition", by M. L. Hammond, *Solid State Technology*, Dec. 1979.
"Ion Beam Epitaxy of Silicon on Ge and Si at Temperatures of 400K", by Zalm et al., *Appl. Phys. Lett.* 41(2), Jul. 15, 1982.
"Computer Simulation in Silicon Epitaxy", by Reif et al., *J. Electrochem. Soc.: Solid-State Science and Technology*, 4/81.
"Autodoping Effects in Silicon Epitaxy", by G. R. Srinivasan, *J. Electrochem. Soc.: Solid-State Science and Technology*, 6/80.
"Silicon Epitaxy at Reduced Pressure", by R. B. Herring, *Semiconductor Silicon*, Electrochem. Soc., 126 (1979).
"Low-Pressure Silicon Epitaxy", by Krullmann et al., *IEEE Transactions on Electron Devices*, vol. ED-29, No. 4, 4/82.
Epitaxial Growth of Silicon From SiH$_4$ in the Temperature Range 800°-1150° C., *Solid State Electronics*, 1973, vol. 16, pp. 39-42, Townsend et al.
Effect of Si-Ge Buffer Layer for Low-Temperature Si Epitaxial Growth on Si Substrate by rf Plasma Chemical Vapor Deposition, *J. Appl. Phys.* 54(3), Mar. 1983, Suzuki et al.
Silicon Epitaxy by Plasma Dissociation of Silane, Proc. 11th Congress (1979) International) on Solid State Devices, 647 (1974), Suzuki et al.
Epitaxial Growth of Si-Ge Layers on Si Substrates by Plasma Dissociation of SiH$_4$ and GeH$_4$ Mixture, *J. Appl. Phys.* 54 (11), Nov. 1983, Suzuki et al.
Richman et al, "Low-Temperature Vapor Growth of Homoepitaxial Silicon", *R.C.A. Review*, Dec. 1970, vol. 31, pp. 613-619.

*Primary Examiner*—William G. Saba
*Attorney, Agent, or Firm*—Hamilton, Brook, Smith & Reynolds

[57] ABSTRACT

A method and apparatus for low temperature deposition of epitaxial films using low pressure chemical vapor deposition (CVD) with and without plasma enhancement. More specifically, the process enables CVD of epitaxial silicon at temperatures below 800° C. by use of an *in situ* argon plasma sputter cleaning treatment of the silicon substrate prior to deposition.

12 Claims, 1 Drawing Figure

GROWTH OF EPITAXIAL FILMS BY CHEMICAL VAPOR DEPOSITION UTILIZING A SURFACE CLEANING STEP IMMEDIATELY BEFORE DEPOSITION

GOVERNMENT SPONSORSHIP

This invention was made in the course of work supported by the Army Research Office Contract No. DAAG-29-81-K-0087 and NSF Grant No. MRL DMR81-19295.

TECHNICAL FIELD

The present invention relates to growth of epitaxial films.

SUMMARY OF TERMS

EPITAXY—the process of growing a single-crystalline film of material on a single-crystalline substrate or wafer. Generally the crystal structure or orientation of the film is the same as that of the substrate; however, the concentration and/or type of intentionally introduced impurities is usually different in the film than in the substrate. This characteristic of epitaxial films makes it possible to manufacture certain types of electronic devices, most notably Bipolar and Complementary Metal Oxide Semiconductor (CMOS) transistors.

NATIVE OXIDE—the oxide that forms on a surface exposed to air. For example, silicon and aluminum in air always have an $SiO_2$ and a $Al_2O_3$ coating respectively. $SiO_2$, which is amorphous (without crystal structure), must be removed from the surface silicon to be able to grow epitaxial films on the single-crystalline silicon surface.

CHEMICAL VAPOR DEPOSITION (CVD)—a method for depositing films. Gaseous molecules are introduced into a reactor and undergo a chemical reaction. For example, $SiH_4$ decomposes into a silicon atom which is adsorbed on the surface and two $H_2$ molecules which subsequently desorb or leave the surface. The adsorbed atom, although bound to the surface, can move around on the surface before becoming chemically bonded to the substrate. In the case of epitaxial growth, this allows the atom to reach an energetically favorable location on the surface where it can become incorporated into the crystal lattice thereby extending the substrate crystal structure into the growing film.

CVD is accomplished at reactor pressures ranging from $10^{-3}$ Torr to atmospheric pressure (760 Torr). This aspect of CVD, along with the chemical nature of the process, makes it possible to deposit uniform, conformal (i.e., good side wall and step coverage) films on many wafers at a time.

CARRIER GAS—in a conventional CVD process, the silicon source, e.g., $SiH_4$ or $SiCl_4$, is diluted in another gas, such as $H_2$, $N_2$ or He. These are called carrier gases and serve to control the atmosphere of the reactor and possibly to moderate the chemical reaction rate.

PHYSICAL VAPOR DEPOSITION—another method for depositing films, an example of which is molecular beam epitaxy. Atoms of the material to be deposited are introduced into a vacuum chamber at pressures typically less than $10^{-7}$ Torr. At these low pressures, the atoms move with few, if any, gas phase collisions and deposit on any surface they reach. When these atoms land on a hot wafer surface, they behave just as the adsorbed atoms in a CVD reactor behave.

The advantage of physical vapor deposition (PVD) is that the ultrahigh vacuum provides a clean environment for the deposition. On the other hand, PVD does not attain conformal coverage due to the line-of-sight path taken by the depositing atoms (i.e., shadowing effects occur). This property makes it difficult to deposit a film on more than a few wafers at a time. Furthermore, the ultrahigh vacuum is difficult to maintain, thereby further reducing the throughput of the process. PVD is able, however, to deposit unique combinations of materials that cannot be done with CVD and is thus used by those building heterojunction devices.

PLASMA/GLOW DISCHARGE—these terms are used interchangeably to describe a partially ionized (electrically charged) gas. For the type of plasma used in semiconductor processing, the fraction of the gas that is ionized is only $10^{-6}$–$10^{-4}$. However, a large percentage of the neutral species are highly reactive, excited gas species called radicals. These radicals, which do not normally exist without a plasma (or some other form of excitation), are created by gas phase collisions with electrons and/or ionized species driven by some type of electric field (usually an RF field applied between two electrodes in or near the gas).

PLASMA ENHANCEMENT—means that some process has had a plasma added to it to take advantage of the ions and/or the radicals in the plasma. For example, CVD can use plasma enhancement to increase the reaction rate of a chemical reaction that can already occur, or drive a chemical reaction that does not occur at all without the plasma.

SPUTTERING—a process in which atoms on a surface are knocked away by an impinging energetic particle. This is done by creating a plasma around the target (e.g., a wafer) and directing ions from the plasma into the target with an electric field. Applying such a field, which is called biasing, is done by applying a negative voltage to the target relative to ground, thereby attracting positive ions, such as those formed in an argon plasma, to the target.

PLASMA CLEANING—the reactive radicals in a plasma can be used to chemically remove (etch) material from the wafer surface. This method can be combined with sputtering by sputtering with a chemically reactive gas and is called "reactive ion etching".

DOPING—intentionally putting impurities, dopants, into a material to influence its electrical properties. For example, in silicon epitaxial growth, the dopants occupy the same lattice sites that a silicon atom would occupy, except that the dopant contributes either one less or one more electron to chemical bonding than a silicon atom would. It is this extra electron or hole (the lack of an electron) that influences the silicon's electrical properties. Controlling the location of these dopants in the silicon is what constitutes the building of solid-state devices, such as transistors. When attempting to dope a film, the dopants sometimes do not occupy lattice sites, which means that these dopants are not electrically active (i.e., able to influence the silicon's electrical properties by bonding with surrounding silicon atoms). These dopants are moved into lattice sites by annealing (subjecting to a high temperature for some period of time) the wafer.

IN-SITU—this expression is used to describe a process being done inside the reactor or being done at the same time as some other process. Thus, in-situ cleaning refers to cleaning done in the deposition reactor and in-situ doping of a film refers to doping done during the deposition process rather than afterwards in a separate process, such as a separate diffusion or ion implantation process.

BACKGROUND ART

Epitaxy is used in integrated circuit technology to create single-crystal layers, or films, on top of single-crystal substrates such that the resistivity and dopant type of the layer can be adjusted independently of the resistivity and dopant type of the substrate. These films are used in such integrated circuit technologies, such as, Bipolar, I$^2$L, CMOS, VMOS and Silicon on Sapphire, as well as in the fabrication of power, microwave imaging and solar-energy-conversion devices.

Silicon (Si), because of its excellent physical properties, is the primary element utilized in fabricating integrated circuits. Although other elements or compounds may also be used, the description herein will purposely refer to silicon, because of its present importance.

Silicon epitaxial films are conventionally grown using atmospheric pressure Chemical Vapor Deposition (CVD) [M. L. Hammond, Solid State Technology, 22, 61 (1979)]at temperatures of 1050-1150° C. To accommodate the small cell sizes required for future VLSI designs, very thin (0.5-1.5 μm), lightly doped epitaxial films on top of heavily doped substrates are required. However, there are severe technological limitations that prevent the fabrication of such films [R. Reif and R. W. Dutton, J. Electrochem. Soc., 128, 909 (1981)].

When lightly doped epitaxial films are deposited on heavily doped substrates at the high temperatures used by conventional processes, a considerable transfer of dopants from the substrate to the growing film takes place. This transfer results in a transition region extending 1.5-2.5 μm into the epitaxial layer within which the doping level changes only gradually with position. The existence of this transition region clearly prevents the fabrication of extremely thin, lightly doped epitaxial films.

The transfer of dopants is caused by two mechanisms: solid-state diffusion, which is caused by the random thermal motion of atoms, and autodoping, which is caused by the redeposition of dopants that have evaporated from surfaces in the reactor, such as those of the wafers and the susceptor [G. R. Srinivasan, J. Electrochem. Soc., 127, 1334 (1980)]. By growing epitaxial films at reduced pressures (40-100 Torr) [R. B. Herring, "Semiconductor Silicon", R. R. Hanerecht and E. L. Kern, eds., Electrochem. Soc., 126 (1979)], the autodoping problem is ameliorated; however, the most important deposition parameter controlling dopant redistribution is temperature. Therefore, by lowering the process temperature, thermal diffusion and impurity evaporation are reduced and thus more abrupt transitions can be obtained [R. Reif and R. W. Dutton, J. Electrochem. Soc., 128, 909 (1981)]. Furthermore, lower pressure and lower temperature have also been shown to reduce pattern shift and distortion [E. Krullman and W. L. Engl, IEEE Trans. Electron. Devices, ED-29, 491 (1982)] and wafer warpage [H. H. Steinbeck, 150th Electromechanical Soc. Meeting, Abs. 352, October 1976], respectively, both of which create alignment problems for small-scale lithography.

A lower process temperature for epitaxial films is clearly desirable for future processes; however, the lower temperature creates two new problems that must be considered. In the conventional process, silicon's native oxide is removed by hydrogen reduction at high temperatures to expose the silicon lattice. Next, gaseous species are transported to the wafer surface where they undergo thermally-driven chemical reactions. The resulting adatoms, atoms that have been adsorbed on the surface, must then migrate to energetically favorable surface sites to be incorporated into the crystalline lattice. Lowering the process temperature complicates the removal of the native oxide and it reduces the surface mobility of the adatoms, both of which make epitaxial growth more difficult, if not impossible.

Low temperature epitaxial films have been grown using silicon molecular beams [Y. Ota, J. Appl. Phys., 51, 1102 (1980); T. Takagi, I. Yamada and A. Sasaki, J. Vac. Sci. Tech., 12, 167 (1982); P. C. Zalm and L. J. Beckers, Appl. Phys. Lett., 54, 1466 (1983)]. The higher the degree of ionization of these beams, the lower the temperature at which epitaxial films can be grown. Using a completely ionized beam, silicon epitaxial films have been deposited at 125° C. [P. C. Zalm and L. J. Beckers, Appl. Phys. Lett., 41, 167 (1982)]. However, molecular beam technology, because of the required relatively high vacuum, will probably prove to be impractical in a high volume manufacturing environment.

W. G. Townsend et al. [W. G. Townsend and M. E. Uddin, Solid State Elec., 16, 39 (1973)] reported epitaxial growth of silicon at temperatures in the range of 800°-1150° C. Their wafer was immersed in a 300 watt hydrogen plasma prior to the deposition. Silane was added to begin the deposition, which was done at a total pressure of 0.6 Torr with a 1:10 silane:hydrogen mixture. Townsend et al. attained epitaxy at temperatures as low as 800° C. Plasma enhancement during deposition was required to sustain epitaxial growth at 800° C.

Suzuki et al. [S. Suzuki and T. Itoh, J. Appl. Phys., 54, 1466 (1983) and S. Suzuki, H. Okuda, T. Itoh, Proc. 11th Congress (1979 International) on Solid State Devices, 647 (1974)], use a low temperature plasma enhanced CVD to obtain epitaxial films at 750° C. The wafer is not immersed in the plasma (i.e., it is below the plasma region) and the cleaning procedure uses a GeH$_4$ plasma. The in-situ cleaning procedure is not explained well, but it is believed the radicals from the GeH$_4$ plasma reach the wafer and react with the native oxide to form the volatile species GeO$_2$ which can be pumped away. However, some germanium is also deposited on the wafer resulting in a 5-7% germanium concentration in the first 1000 Å of the silicon epitaxial film. In their most recent work, Suzuki et al. [S. Suzuki and T. Itoh "Epitaxial Growth of Si-Ge Layers on Si Substrates by Plasma Dissociation of SiH$_4$ and GeH$_4$ Mixture" J. Appl. Phys. 54(11), (November 1983)] leave the GeH$_4$ flow on during the entire deposition to form a 5-7% Ge/Si alloy throughout the epitaxial film.

A need therefore still exists for a low pressure CVD process which can deposit uniform epitaxial films at temperatures below 800° C. with or without plasma enhancement and which does not introduce unwanted concentrations of elements in the film.

DISCLOSURE OF THE INVENTION

The invention comprises a method and apparatus for low-temperature epitaxial growth of films, preferably silicon films, using a low pressure chemical vapor deposition process.

The apparatus comprises a CVD reactor chamber consisting of a quartz tube sealed at each end by steel endplates. A silicon substrate or wafer is disposed in the chamber. The surface of the substrate, upon which the CVD epitaxial film is to be deposited, faces a heat source, such as a lamp. An RF circuit is provided for ionizing the gas in the chamber.

The RF circuit comprises an RF voltage generator, means for coupling the RF voltage to the gas within the chamber to produce a plasma (ionized gas), and a voltage bias for directing the flow of ionized gas molecules toward the deposition surface of the wafer to sputter clean the surface in situ prior to CVD. Pumps are provided for establishing an appropriate pressure in a clean vacuum chamber during the process. The method comprises:

(1) dipping the wafer into a solution to remove native oxide,
(2) loading the wafer into the chamber,
(3) establishing a deposition temperature in the chamber and purging the chamber with an inert gas,
(4) in situ cleaning the wafer deposition surface to remove material which impedes epitaxial growth, such as native oxide, by sputtering the surface with an inert gas (preferably argon) plasma, and
(5) establishing a flow of a suitable gas reactant containing Si, such as, silane ($SiH_4$) or $SiCl_4$, $SiHCl_3$, $SiH_2Cl_2$, or $Si_2H_6$, and growing an epitaxial film of silicon (Si) on the wafer by CVD at a substrate temperature below 800° C. and a pressure of about $10^{-2}$ Torr.

During Step 5, above, plasma enhancement may be provided by maintaining voltage on the RF generator circuit. Smooth, specular epitaxial films can be obtained with or without plasma enhancement. However, the growth rates are faster with plasma enhancement.

BEST MODE OF CARRYING OUT THE INVENTION

Figure 1:
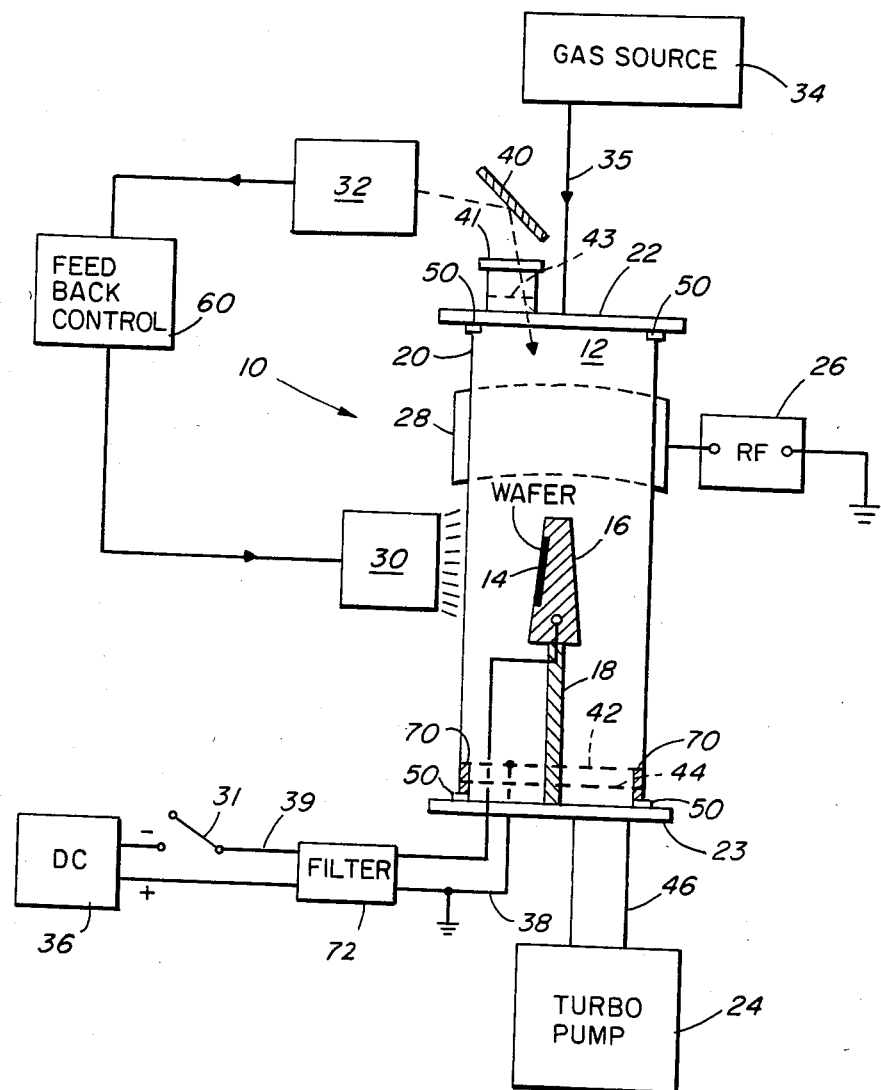
FIG. 1 is a schematic representation of the reactor chamber and accessory apparatus used in practicing the method of the invention.

The reactor 10 of the present invention consists of a gas distribution system (Source 34), and a chamber 12, a heating system 30, a pumping system 24, and an RF circuit (RF Generator 26, electrodes 42 and 28 and DC voltage source 36). High purity gases (less than 0.1 ppm each of $O_2$, $H_2O$, etc.) are delivered to the chamber 12 through stainless steel, welded lines 35. The gas flows are controlled using mass flow controllers (not shown). The available gases from source 34 are argon, nitrogen, hydrogen, silane, and arsine. The chamber 12 consists of a cylindrical quartz tube 20 (160 mm ID, 380 mm high) sealed to stainless steel endplates 22 and 23 by silicone gaskets 50.

A wafer 14 sits on a graphite susceptor 16 facing a radiant heater 30 (6×6 Kwatt infrared lamps). Susceptor 16 is supported by quartz tube 18. The wafer temperature (calibrated using melting point standards on a dummy wafer) is monitored by an infrared pyrometer 32 that looks through a mirror 40 and a window 41 in the top of the chamber. A mesh 43 between the window and the plasma prevents deposition on the window 41. A voltage feedback loop 60 controls the lamp power of heater 30. The chamber 12 is pumped on by a 510 l/s turbomolecular pump 24. The chamber base pressure is $10^{-7}$ Torr and the leak rate for the chamber is less than $3 \times 10^{-4}$ Torr/min. A gate valve (not shown) above the pump 24 is used to set the chamber pressure.

The RF generator 26 is a 1 Kwatt, 13.56 MHz generator with an automatic matching network. The RF voltage from generator 26 is coupled to the gas in the chamber 12 by an external copper plate 28 wrapped around the top third of the chamber. The RF current return path is through a silicon-coated stainless steel false bottom which comprises two perforated stainless steel plates 42 and 44 suspended from bottom plate 23 by ceramic supports 70.

Plate 42 is located 2 cm above the bottom plate 23. The top plate 42 is coupled to ground via wire 38 and the bottom plate 44 is electrically floating to control the RF current path. This electrical configuration, combined with the low operating pressure, provides a very uniform plasma.

DC bias of about 300 volts is applied from DC voltage source 36 via lead 39 between the false bottom plate 42 and the base of graphite susceptor 16 when switch 31 is in the ON position.

Before commencing a series of depositions, the chamber 12 and its contents are preferably coated with silicon using silane gas $SiH_4$ from source 34. The silane is ionized by RF generator 26 to form a plasma and silicon is deposited on the surfaces of the chamber and the contents, such as susceptor 16 and plates 42 and 22. Besides providing a silicon environment for subsequent depositions, the precoating eliminates large fluctuations in the temperature control loop 60 that would occur at the beginning of a plasma deposition as the wall of tube 20 in front of the lamps in source 30 are first coated.

The wafer 14 is first cleaned outside the reactor using standard techniques. The chamber 12 is backfilled with nitrogen from source 34. The previous run is unloaded and the cleaned wafer 14 is dipped in a 10:1 DI $H_2O/HF$ solution. The wafer 14 is next loaded onto the susceptor 16 and the chamber 12 is pumped down to $10^{-7}$ Torr by pump 24. The chamber is then cyclically purged with argon. The lamps in heat source 30 are turned on to bake out the chamber and to establish the deposition temperature of preferably between 600° C. to 800° C., and then the chamber is once again cyclically purged with argon from source 34.

Next, and most importantly, the wafer 14 is cleaned for about five minutes in an argon plasma of 50 watts at the deposition temperature with a 300 volt DC bias applied to the susceptor 16 relative to RF ground through an RF filter 72. The argon flow during cleaning is 5 sccm and the pressure is about $5 \times 10^{-3}$ Torr. At the conclusion of the argon sputter cleaning step, the RF power from generator 26 is either turned off or reduced to 20 watts.

Next, silane flow is established (14 sccm, $15 \times 10^{-3}$ Torr) for CVD of the Si on the wafer 14 and the argon flow is stopped. If DC biasing is desired during plasma enhancement, then the applied DC potential used during sputter cleaning is maintained. Otherwise, the DC bias line 39 is open circuited by placing switch 31 in the OFF position to allow the susceptor 16 to electrically float.

The most critical stage of the process is the five minute in situ cleaning of the wafer surface in the argon plasma. We have found that if either the DC bias during the argon plasma sputter step was removed or if the argon plasma was eliminated altogether, then only polycrystalline films are obtained. With only 100 or 200 volts of applied DC bias we were able to get hazy epitaxial films with very rough surfaces, but only if the plasma was subsequently used during the deposition. When a 300 volt bias was applied during the sputter argon cleaning step, we were able to grow smooth, specular epitaxial films of identical quality with or without the plasma during the deposition. If the 300 volt bias was also applied during the deposition, the same result was obtained. The thicknesses of the films ranged between 1 and 2 microns, as determined by weight, and were uniform to within ±5% as determined by depositing a film on an oxidized wafer and using a profilometer. The growth rates at 775° C. were 340±40 Å/min (3 wafers) without plasma and 450±40 Å/min (4 wafers) with plasma. The substrate orientation was <111> misaligned by 10° to the nearest [110] so that X-ray spectra with peaks indicated polycrystalline films. Transmission Electron Diffraction (TED) micrographs of the epitaxial films show the spot pattern and Kikuchi lines characteristic of a single crystal structure.

The above results demonstrate that the plasma enhancement of the process affects the deposition in terms of growth rate even at low RF power, indicative of the highly reactive radicals present in the plasma. However, under the growth conditions disclosed herein, film structure and morphology are critically dependent on predeposition in situ cleaning, and not on the presence of the plasma during the deposition. We have thus demonstrated that the successful removal of native oxide (such as by in situ plasma sputtering) is the major barrier to be overcome in producing a low temperature epitaxial processes. It is also possible that the argon bombardment, which occurs during sputtering in our process, creates nucleation sites on the surface.

In summary, using the apparatus of the invention, specular epitaxial films have been deposited at temperatures as low as 650° C. using low pressure CVD both with and without plasma enhancement. This is the lowest silicon epitaxial deposition temperature and the lowest pre-epitaxial cleaning temperature believed reported for thermally driven CVD.

Many equivalents to the apparatus and method disclosed herein may be found by those skilled in the art, based upon the description provided herein. Argon is suggested herein for use as a gas for sputter cleaning because it has relatively heavy ions, as compared to, for example, the hydrogen of Townsend, et al. and because of its inertness, as compared to the GeH$_4$ of Suzuki et al. However, other inert gases, such as neon, may prove equally acceptable. Also, as indicated earlier, the present process may prove to be useful in CVD of semiconductor materials other than Si. Accordingly, this invention is not to be limited except as provided in the following claims.

We claim:

1. A chemical vapor deposition process for forming epitaxial films on a substrate at relatively low temperatures comprising the steps of:
    (a) cleaning the surface of the substrate in a reaction chamber to remove material which impedes epitaxial growth, while concurrently maintaining the substrate at a predetermined temperature near the deposition temperature of less than 800° C.; and
    (b) terminating said cleaning step (a) and immediately introducing a gaseous reactant into said reaction chamber at relatively low chamber pressure of about $10^{-1}$ Torr or less, said reactant containing an element of the film to be deposited while maintaining the substrate at the desired deposition temperature to promptly form on said surface an epitaxial film of said element.

2. The process of claim 1 in which the substrate is single crystalline semiconductor, the material to be removed is $SiO_2$, and the gas reactant is a gas containing Si and the cleaning is accomplished by ion bombardment caused by ions from an inert gas introduced into the chamber and evacuated before step (b).

3. The process of claim 2 in which the substrate surface temperature is 800° C. or less during film formation.

4. The process of claim 3 in which the pressure in the chamber is in the range of about $10^{-3}$ Torr to $10^{-1}$ Torr.

5. The process of claim 1 in which the cleaning is accomplished by ionizing an inert gas in the chamber to form a plasma and directing the ions from said inert gas towards the surface of the substrate.

6. The process of claim 5 in which the substrate surface is immersed in the inert gas plasma during step (b) to enhance film formation.

7. The process of claims 5 and 6 in which the inert gas is argon or neon.

8. An epitaxy process for depositing an epitaxial Si film comprising:
    (a) cleaning the surface of silicon substrate disposed in a reaction chamber to remove epitaxially growth impeding substances found on the substrate surface while keeping the substrate temperature near the deposition temperature of less than 800° C. and
    (b) introducing a gas reactant containing Si into the chamber at a relatively low chamber pressure of $10^{-1}$ Torr or less to form an epitaxial film of Si from said reactant gas on said surface by chemical vapor deposition upon terminating the cleaning step (a).

9. The process of claim 8 in which the substrate surface temperature is maintained between the range of 400° C. to less than 800° C. during steps (a) and (b) film formation.

10. The process of claim 8 in which the cleaning in step (a) is accomplished by ion bombardment caused by ionizing an inert gas in the chamber to form a plasma and electrically directing the ions from said inert gas towards the surface of the substrate.

11. A method of growing epitaxial films on a surface of substrate comprising the steps of:
    (a) disposing the substrate in a reaction chamber;
    (b) while in the reaction chamber, subjecting the surface of the substrate to a cleaning process to remove for a period of time epitaxial growth impeding substances found on the surface;
    (c) during a portion of the cleaning time in step (b), including just prior to termination of said cleaning, heating the substrate to bring it to a temperature at or near the deposition temperature;
    (d) immediately thereafter step (c) bringing the substrate to a deposition temperature of about 800° C. or less in the presence of a gas having molecules to be deposited on said surface and at a chamber pressure in the order of about $10^{-1}$ to $10^{-3}$ Torr to decomposed said gas and cause said decomposed elements to deposite on said surface without plasma enhancement and form an epitaxial film.

12. The method of claim 11 in which the substrate is Si, the cleaning is accomplished by ion bombardment and the ions are argon or neon ions formed by subjecting the inert gas to an RF field and the film is a silicon film and the gas used for deposition is taken from the group comprising: $SiH_4$, $SiCl_4$, $SiHCl_3$, $SiH_2Cl_2$, or $Si_2H_6$.

* * * * *